US008152953B2

(12) United States Patent
Yoshimura et al.

(10) Patent No.: US 8,152,953 B2
(45) Date of Patent: Apr. 10, 2012

(54) METHOD OF MAKING PRINTED WIRING BOARD AND METHOD OF MAKING PRINTED CIRCUIT BOARD UNIT

(75) Inventors: Hideaki Yoshimura, Kawasaki (JP);
Takashi Nakagawa, Kawasaki (JP);
Kenji Fukuzono, Kawasaki (JP);
Takashi Kanda, Kawasaki (JP);
Tomohisa Yagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 14 days.

(21) Appl. No.: 12/365,279

(22) Filed: Feb. 4, 2009

(65) Prior Publication Data

US 2009/0294056 A1    Dec. 3, 2009

(30) Foreign Application Priority Data

May 30, 2008    (JP) .................... 2008-143664

(51) Int. Cl.
*B32B 37/12*    (2006.01)
(52) U.S. Cl. ........................................ 156/327
(58) Field of Classification Search ............... 156/327
See application file for complete search history.

(56) References Cited

U.S. PATENT DOCUMENTS

| | | | |
|---|---|---|---|
| 4,667,401 A | 5/1987 | Clements et al. | |
| 4,696,764 A | 9/1987 | Yamazaki | |
| 4,859,364 A | 8/1989 | Yamamoto et al. | |
| 5,242,511 A | 9/1993 | Yokoyama et al. | |
| 5,445,308 A * | 8/1995 | Nelson et al. ............... | 228/121 |
| 5,573,602 A | 11/1996 | Banerji et al. | |
| 5,648,123 A | 7/1997 | Kuhn et al. | |
| 5,652,042 A | 7/1997 | Kawakita et al. | |
| 5,949,030 A | 9/1999 | Fasano et al. | |
| 6,139,777 A | 10/2000 | Omoya et al. | |
| 6,479,763 B1 | 11/2002 | Igaki et al. | |
| 6,851,599 B2 | 2/2005 | Nakamura et al. | |
| 6,869,665 B2 | 3/2005 | Tani et al. | |
| 7,224,046 B2 | 5/2007 | Abe et al. | |
| 7,307,852 B2 | 12/2007 | Inagaki et al. | |
| 7,345,246 B2 | 3/2008 | Muramatsu et al. | |

(Continued)

FOREIGN PATENT DOCUMENTS

CN    1465219 A    12/2003
(Continued)

OTHER PUBLICATIONS

Korean Office Action dated Oct. 21, 2010, issued in corresponding Korean Patent Application No. 10-2009-0019785.

(Continued)

*Primary Examiner* — Katarzyna Wyrozebski Lee
*Assistant Examiner* — Daniel Lee
(74) *Attorney, Agent, or Firm* — Westerman, Hattori, Daniels & Adrian, LLP

(57) ABSTRACT

The first support body is pressed against the second support body in response to the softening of the adhesive sheet. The fillers are allowed to reliably contact with one another between the first electrically-conductive land and the second electrically-conductive land. The fillers melt after the adhesive sheet has been softened. The intermetallic compounds are formed between the fillers and the electrically-conductive lands and between the fillers. Electrical connection is in this manner established between the first electrically-conductive land and the second electrically-conductive land. The matrix material and the adhesive sheet are then cured. The first support body and the second support body are firmly bonded to each other.

6 Claims, 10 Drawing Sheets

U.S. PATENT DOCUMENTS

| | | | |
|---|---|---|---|
| 7,507,913 | B2 | 3/2009 | Inagaki et al. |
| 7,640,660 | B2 | 1/2010 | Abe et al. |
| 7,696,442 | B2 | 4/2010 | Muramatsu et al. |
| 7,842,887 | B2 | 11/2010 | Sakamoto et al. |
| 7,855,894 | B2 | 12/2010 | Inagaki et al. |
| 7,864,542 | B2 | 1/2011 | Inagaki et al. |
| 2003/0196833 | A1 | 10/2003 | Fujii et al. |
| 2004/0011855 | A1 | 1/2004 | Nakamura et al. |
| 2004/0151882 | A1 | 8/2004 | Tani et al. |
| 2004/0238209 | A1 | 12/2004 | Yuri et al. |
| 2005/0172483 | A1 | 8/2005 | Sugita et al. |
| 2005/0266213 | A1* | 12/2005 | Kanda et al. ............ 428/209 |
| 2006/0118329 | A1 | 6/2006 | Nakamura |

FOREIGN PATENT DOCUMENTS

| | | | |
|---|---|---|---|
| CN | 1698138 A | | 11/2005 |
| EP | 0 793 405 A2 | | 3/1997 |
| JP | 10-007933 A | | 1/1998 |
| JP | 2003-273518 A | | 9/2003 |
| JP | 2003-527736 A | | 9/2003 |
| JP | 2004-031730 A | | 1/2004 |
| JP | 2004-031731 A | | 1/2004 |
| JP | 2004-289006 A | | 10/2004 |
| JP | 2005-71825 A | | 3/2005 |
| JP | 2005-347414 A | | 12/2005 |
| KR | 1999-0044871 A | | 6/1999 |
| KR | 2003-0027111 A | | 4/2003 |
| KR | 10-2004-0027326 A1 | | 4/2004 |
| TW | 200414860 A | | 8/2004 |
| WO | 99/56509 A1 | | 11/1999 |

OTHER PUBLICATIONS

Chinese Office Action dated Jan. 19, 2011, issued in corresponding Chinese Patent Application No. 200910126964.X.
USPTO Office Action dated May 31, 2011, issued in U.S. Appl. No. 12/390,131.
Korean Office Action dated Oct. 21, 2010, issued in corresponding Korean Patent Application No. 10-2009-0020281.
Korean Office Action dated Oct. 21, 2010, issued in corresponding Korean Patent Application No. 10-2009-0019784.
USPTO Office Action dated May 31, 2011, issued in U.S. Appl. No. 12/390,168.
USPTO Office Action dated Jun. 30, 2011, issued in U.S. Appl. No. 12/390,010.
Office Action dated Nov. 16, 2011, issued in related U.S. Appl. No. 12/390,131.
Taiwanese Office Action dated Oct. 5, 2011, issued in corresponding Taiwanese Patent Application No. 098104959 (partial translation).
Notice of Allowance and Fees Due dated Oct. 5, 2011, issued in related U.S. Appl. No. 12/390,168.
Notice of Allowance and Fees Due dated Oct. 25, 2011, issued in related U.S. Appl. No. 12/390,010.

* cited by examiner

US 8,152,953 B2

METHOD OF MAKING PRINTED WIRING BOARD AND METHOD OF MAKING PRINTED CIRCUIT BOARD UNIT

CROSS-REFERENCE TO RELATED APPLICATION

This application is based upon and claims the benefit of priority from the prior Japanese Patent Application No. 2008-143664 filed on May 30, 2008, the entire contents of which are incorporated herein by reference.

FIELD

The embodiments discussed herein are related to a technique of bonding substrates together or an electronic component and a substrate together.

BACKGROUND

An electrically-conductive paste is well known. The electrically-conductive paste includes matrix material made of a thermosetting resin and electrically-conductive particles dispersed in the matrix material. The electrically-conductive particles are metallic particles, for example. An adhesive sheet made of a resin material is sandwiched between printed wiring boards so as to bond the printed wiring boards to each other, for example. Lands on the printed wiring boards are opposed to each other through a through bore formed in the adhesive sheet. The through bore is filled with the electrically-conductive paste. The electrically-conductive paste is hardened or cured by heating. The adhesive sheet bonds the printed wiring boards to each other. An electric connection is established between the lands opposed to each other.

It is proposed to bond a build-up layer to a core substrate for establishment of a so-called build-up substrate. It is required to establish a stable electrical connection between a land on the core substrate and a land on the build-up layer when the build-up layer is bonded to the core substrate. The aforementioned electrically-conductive paste cannot provide a reliable bonding between the build-up layer and the core substrate.

SUMMARY

According to an aspect of the invention, a method of making a printed wiring board, includes: setting an adhesive sheet made of a thermosetting resin between a first support body and a second support body so that a first electrically-conductive land on the first support body is opposed to a second electrically-conductive land on the second support body through an opening formed in the adhesive sheet; filling the opening with an electrically-conductive binder including matrix material and fillers when the first electrically-conductive land is opposed to the second electrically-conducive land, the matrix material containing a thermosetting resin, the fillers dispersed in the matrix material so as to unite with the first and second electrically-conductive lands based on intermetallic compounds formed between the fillers and the first and second electrically-conductive lands, respectively; softening the adhesive sheet by heating while the first support body is pressed against the second support body; inducing melting of the fillers by heating after the adhesive sheet has been softened; curing the matrix material by heating after the fillers have molten; and curing the adhesive sheet by heating after the matrix material has been cured.

According to another aspect of the invention, a method of making a printed circuit board unit, includes: setting an adhesive sheet made of a thermosetting resin between a first support body and a second support body so that a first electrically-conductive land on the first support body is opposed to a second electrically-conductive land on the second support body through an opening formed in the adhesive sheet; filling the opening with an electrically-conductive binder including matrix material and fillers when the first electrically-conductive land is opposed to the second electrically-conducive land, the matrix material containing a thermosetting resin, the fillers dispersed in the matrix material so as to unite with the first and second electrically-conductive lands based on intermetallic compounds formed between the fillers and the first and second electrically-conductive lands, respectively; softening the adhesive sheet by heating while the first support body is pressed against the second support body; inducing melting of the fillers by heating after the adhesive sheet has been softened; curing the matrix material by heating after the fillers have molten; and curing the adhesive sheet by heating after the matrix material has been cured.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENT

An embodiment of the present invention will be explained below with reference to the accompanying drawings.

Figure 1:
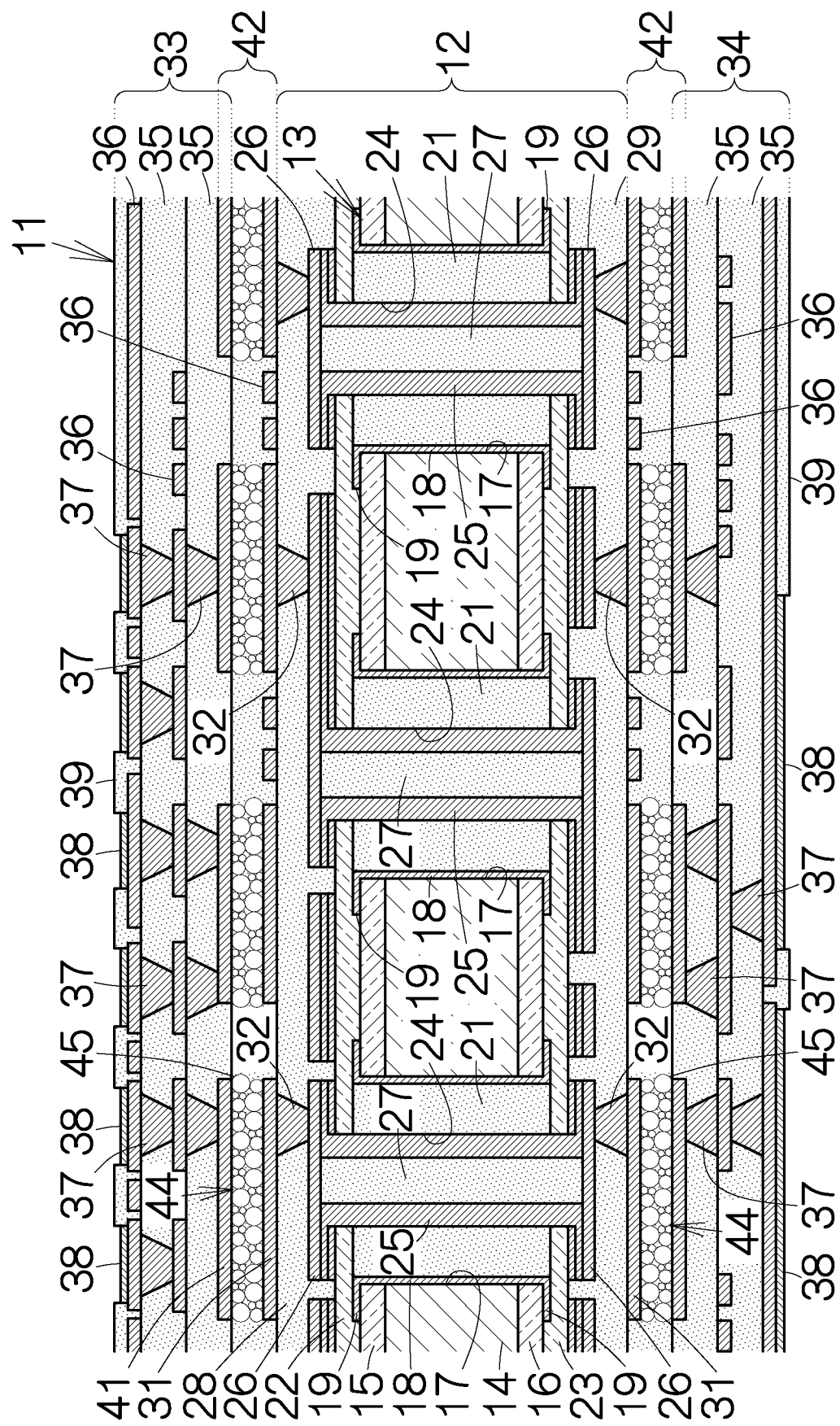
FIG. 1 is a side view schematically illustrating the cross-section of a printed wiring board according to an embodiment of the present invention.

FIG. 1 schematically illustrates the cross-section of a printed wiring board 11 according to an embodiment of the present invention. The printed wiring board 11 is utilized as a probe card, for example. Such a probe card is set in a probe apparatus, for example. It should be noted that the printed wiring board 11 may be utilized in any other electronic apparatus.

The printed wiring board 11 includes a core substrate 12. The core substrate 12 includes a core layer 13 in the form of a thin plate. The core layer 13 includes an electrically-conductive layer 14. Carbon fiber cloth is embedded in the electrically-conductive layer 14. The fibers of the carbon fiber cloth extend in the in-plane direction of the core layer 13. This results in a significant restriction of the thermal expansion of the electrically-conductive layer 14 in the in-plane direction. The carbon fiber cloth has an electrical conductivity. The carbon fiber cloth is impregnated with a resin material so as to form the electrically-conductive layer 14. The resin material is a thermosetting resin such as epoxy resin. The carbon fiber cloth is a woven or nonwoven cloth made of carbon fiber yarns.

The core layer 13 includes core insulating layers 15, 16 overlaid on the front and back surfaces of the electrically-conductive layer 14, respectively. The electrically-conductive layer 14 is sandwiched between the core insulating layers 15, 16. The core insulating layer 15, 16 are insulative. Glass fiber cloth is embedded in the core insulating layers 15, 16. The fibers of the glass fiber cloth extend along the front and back surfaces of the core layer 13. The glass fiber cloth is impregnated with a resin material so as to form the core insulating layers 15, 16. The resin material is a thermosetting resin such as epoxy resin. The glass fiber cloth is a woven or nonwoven cloth made of glass fiber yarns.

Through bores 17 are formed in the core layer 13. The through bores 17 penetrate through the core layer 13. The through bores 17 each define a columnar space. The longitudinal axis of the columnar space is set perpendicular to the front and back surfaces of the core layer 13. The through bores 17 define circular openings on the front and back surfaces of the core layer 13, respectively.

A large-sized via 18 having a large diameter is formed in the individual through bore 17. The large-sized via 18 is electrically conductive. The large-sized via 18 is formed in the shape of a cylinder along the inward wall surface of the through bore 17. The large-sized via 18 is connected to annular electrically-conductive lands 19 on the front and back surfaces of the core layer 13. The electrically-conductive lands 19 extend on the front and back surface of the core layer 13. The large-sized via 18 and the electrically-conductive lands 19 are made of an electrically-conductive material such as copper.

The inner space of the large-sized via 18 in the through bore 17 is filled with a filling material 21 made of a resin material. The filling material 21 takes the form of a cylinder along the inward wall surface of the large-sized via 18. The filling material 21 is a thermosetting resin such as epoxy resin. A ceramic fillers are embedded in the epoxy resin, for example.

The core substrate 12 includes insulating layers 22, 23 overlaid on the front and back surfaces of the core layer 13, respectively. The back surfaces of the insulating layers 22, 23 are received on the front and back surfaces of the core layer 13, respectively. The core layer 13 is sandwiched between the insulating layers 22, 23. The insulating layers 22, 23 cover over the exposed surfaces of the filling material 21. The insulating layers 22, 23 are insulative. Glass fiber cloth is embedded in the insulating layers 22, 23. The fibers of the glass fiber cloth extend along the front and back surfaces of the core layer 13. The glass fiber cloth is impregnated with a resin material so as to form the insulating layers 22, 23. The resin material is a thermosetting resin such as epoxy resin. The glass fiber cloth is a woven or nonwoven cloth made of glass fiber yarns.

Through bores 24 are formed in the core substrate 12. The through bores 24 penetrate through the core layer 13 and the insulating layers 22, 23. The individual through bore 24 is located inside the corresponding through bore 17. The through bore 24 penetrates through the corresponding filling material 21. Here, the through bores 24 each define a columnar space. The individual through bore 24 is coaxial with the corresponding through bore 17. The individual through bore 24 defines circular openings on the front and back surfaces of the core substrate 12, respectively.

A small-sized via 25 having a diameter smaller than that of the large-sized via 18 is formed in the individual through bore 24. The small-sized via 25 is electrically conductive. The small-sized via 25 is formed in the shape of a cylinder along the inward wall surface of the through bore 24. The filling material 21 serves to insulate the large-sized via 18 and the small-sized via 25 from each other. The small-sized via 25 is made of an electrically-conductive material such as copper.

Electrically-conductive lands 26 are formed on the surfaces of the insulating layers 22, 23. The small-seized via 25 is connected to the electrically-conductive lands 26 on the surfaces of the insulating layers 22, 23. The electrically-conductive lands 26 are made of an electrically-conductive material such as copper. The inner space of the small-sized via 25 is filled with a filling material 27 made of an insulating resin between the electrically-conductive lands 26, 26. The filling material 27 is formed in the shape of a column, for example. The filling material 27 is a thermosetting resin such as epoxy resin. Ceramic fillers are embedded in the epoxy resin.

Build-up layers 28, 29 are formed on the surfaces of the insulating layers 22, 23, respectively. The back surfaces of the build-up layers 28, 29 are received on the surfaces of the insulating layers 22, 23, respectively. The core layer 13 and the insulating layers 22, 23 are sandwiched between the build-up layers 28, 29. The build-up layers 28, 29 cover over the electrically-conductive lands 26, 26, respectively. The build-up layers 28, 29 are insulative. Glass fiber cloth is embedded in the build-up layers 28, 29. The fibers of the glass fiber cloth extend along the surfaces of the insulating layers 22, 23. The glass fiber cloth is impregnated with a resin material so as to form the build-up layers 28, 29. The resin material is a thermosetting resin such as epoxy resin. The glass fiber cloth is a woven or nonwoven cloth made of glass fiber yarns.

Electrically-conductive lands 31, 31 are formed on the front surfaces of the build-up layers 28, 29. The electrically-conductive lands 31 extend along the front surfaces of the build-up layers 28, 29. The electrically-conductive lands 31 are electrically connected to the corresponding electrically-conductive lands 26. Vias 32 are formed in the build-up layers 28, 29 to connect the electrically-conductive lands 31 to the electrically-conductive lands 26. Through bores are formed in the build-up layers 28, 29 at positions between the electrically-conductive lands 31 and the corresponding electrically-conductive lands 26 so as to form the vias 32. The through bores are filled with an electrically-conductive material. The electrically-conductive lands 31 and the vias 32 are made of an electrically-conductive material such as copper.

The printed wiring board 11 includes build-up layer units 33, 34 overlaid on the front and back surfaces of the core substrate 12, respectively. The back surfaces of the build-up layer units 33, 34 are received on the front and back surfaces of the core substrate 12, respectively. The build-up layer units 33, 34 each include a layered structure including insulating layers 35 and electrically-conductive patterns 36. The insulating layers 35 and the electrically-conductive patterns 36 are alternatively overlaid on one another. The electrically-conductive patterns 36 in different layers are electrically connected to each other through a via or vias 37. A through bore is formed in the insulating layer 35 at a position between the electrically-conductive patterns 36 so as to form the individual via 37. The through bore is filled with an electrically-conductive material. The insulating layers 35 are made of a thermosetting resin such as epoxy resin. The electrically-conductive patterns 36 and the vias 37 are made of an electrically-conductive material such as copper.

Electrically-conductive pads 38 are exposed on the front surfaces of the build-up layer units 33, 34. The electrically-conductive pads 38 are made of an electrically-conductive material such as copper. An overcoat layer 39 is overlaid on the front surface of the each of the build-up layer units 33, 34 at positions off the electrically-conductive pads 38. The overcoat layer 39 is made of a resin material, for example.

Electrically-conductive lands 41 are exposed on the back surfaces of the build-up layer units 33, 34. The electrically-conductive lands 41 extend along the back surface of the lowest one of the insulating layers 35 in the individual build-up layer unit 33, 34. The electrically-conductive lands 41 are electrically connected to the corresponding electrically-conductive patterns 36 through the vias 37. The electrically-conductive lands 41 are made of an electrically-conductive material such as copper. The electrically-conductive lands 41 are electrically connected to the corresponding electrically-conductive lands 31 as described later in detail. Electrical connection is thus established between the electrically-conductive pads 38 exposed on the front surface of the printed wiring board 11 and the corresponding electrically-conductive pads 38 exposed on the back surface of the printed wiring board 11. When the printed wiring board 11 is set in a probe apparatus, the electrically-conductive pads 38 on the back surface of the printed wiring board 11 are connected to the corresponding electrode terminals of the probe apparatus, for example. When a semiconductor wafer is mounted on the front surface of the printed wiring board 11, for example, the electrically-conductive pads 38 on the front surface of the printed wiring board 11 receive the corresponding electrode bumps of the semiconductor wafer, for example. The electrically-conductive pads 38 are connected to the corresponding electrode bumps. A heat cycle test is then executed so as to examine the semiconductor wafer, for example.

Bonding layers 42, 42 are sandwiched between the core substrate 12 and the build-up layer units 33, 34, respectively. The bonding layers 42 each include an insulating base 43. The insulating base 43 is insulative. The insulating base 43 is made of a thermosetting resin such as epoxy resin. Glass fiber cloth may be embedded in the insulating base 43 in the same manner as described above, for example.

Figure 2:
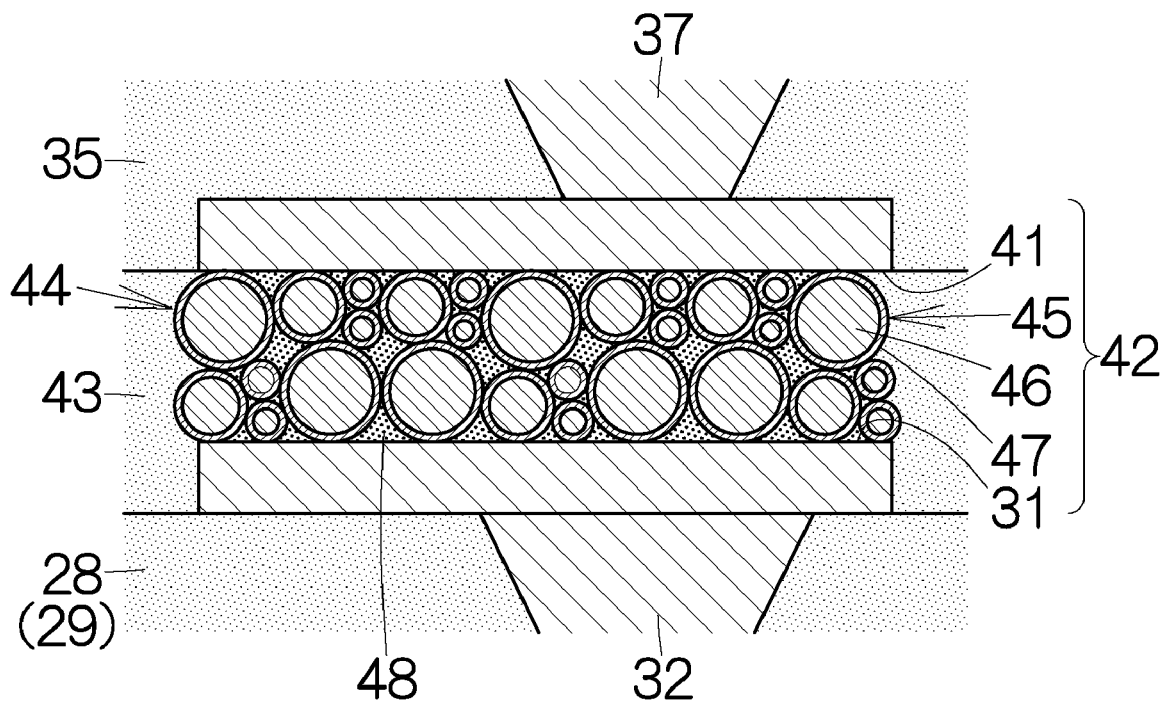
FIG. 2 is an enlarged partial sectional view schematically illustrating an electrically-conductive body.

Electrically-conductive bodies 44 are embedded in the bonding layers 42. The individual electrically-conductive body 44 is sandwiched between the corresponding electrically-conductive lands 31, 41. The electrically-conductive body 44 includes a number of spherical conductive bodies 45. The individual spherical conductive body 45 includes a metallic fine particle 46 such as a copper particle, as depicted in FIG. 2. The surface of the metallic fine particle 46 is coated with a copper-tin alloy layer 47. The copper-tin alloy layer 47 on the metallic fine particle 46 is in contact with the copper-tin alloy layers 47 on the adjacent metallic fine particles 46. The copper-tin alloy layers 47 serve to establish an electric connection between the electrically-conductive lands 31, 41. The melting point of the copper-tin alloy exceeds 400 degrees Celsius.

The metallic fine particles 46 are embedded in a bismuth material 48. The bismuth material 48 fills a space between the metallic fine particles 46 in the electrically-conductive body 44. This results in suppression of the electrical resistance of the electrically-conductive body 44. A sufficient electrical conduction is established. Moreover, the bismuth material 48 has the melting point equal to 270 degrees Celsius. Bonding between the electrically-conductive lands 31, 41 is thus reliably maintained unless the bismuth material 48 is heated to a temperature exceeding 271 degrees Celsius. The aforementioned insulating base 43 surrounds the bismuth material 48.

Figure 3:
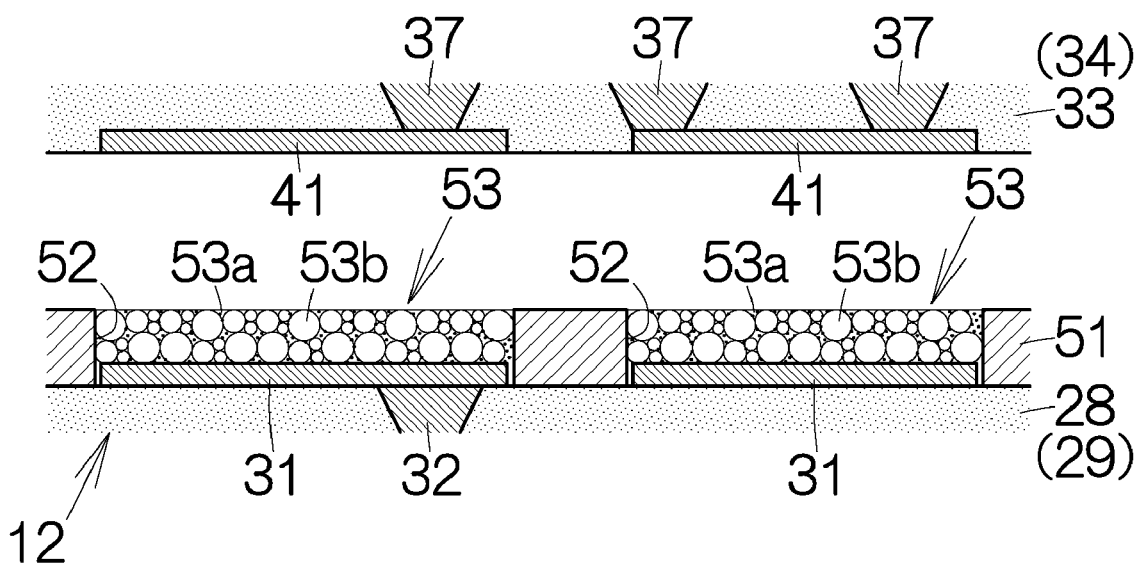
FIG. 3 is an enlarged partial sectional view schematically illustrating an adhesive sheet and an electrically-conductive binder for bonding a core substrate and a build-up layer unit.

Next, description will be made on a method of making the printed wiring board 11. The core substrate 12 is first prepared. Simultaneously, the build-up layer units 34, 34 are prepared. A method of making the build-up layer units 33, 34 will be described later in detail. Adhesive sheets 51 are overlaid on the front and back surfaces of the core substrate 12, respectively, as depicted in FIG. 3. The back surfaces of the adhesive sheets 51 are received on the front and back surfaces of the core substrate 12, respectively. The build-up layer units 33, 34 are overlaid on the corresponding front surfaces of the adhesive sheets 51, respectively. The adhesive sheets 51 are made of a thermosetting resin such as epoxy resin. Glass fiber cloth may be embedded in the adhesive sheets 51, for example.

An opening 52 is formed in the individual adhesive sheet 51 at a position between the electrically-conductive lands 31, 41. The opening 52 penetrates through the adhesive sheet 51. The electrically-conductive lands 31, 41 are opposed to each other through the opening 52. The shape of the opening 52 may be determined depending on the shape of the electrically-conductive lands 31, 41. The opening 52 is filled with an electrically-conductive binder 53. A screen printing process may be employed to fill the opening 52 with the electrically-conductive binder 53.

The electrically-conductive binder 53 includes matrix material 53a made of a thermosetting resin. The thermosetting resin is epoxy resin, for example. A hardener, such as a carboxyl group, an amino group or a phenolic group, is added to the epoxy resin. An activator, such as an adipic acid, a succinic acid, or a sebacic acid, is also added to the epoxy resin.

Fillers 53b disperse in the matrix material 53a. The fillers 53b include metallic fine particles, namely copper particles, each having the surface fully coated with a tin-bismuth alloy. The tin-bismuth alloy contains bismuth in a range from 50 wt % to 60 wt % (preferably at 58 wt % approximately). The tin-bismuth alloy of this type is prevented from shrinkage to the utmost when the tin bismuth alloy is cured or hardened. The melting point of the tin-bismuth alloy resides in a range between 139 degrees Celsius and 150 degrees Celsius. The tin-bismuth alloy may be plated entirely over the surface of the individual copper particle. The thickness of such a tin-bismuth alloy layer may be set in a range from 1.0 µm to 5.0 µm. The thickness of the tin-bismuth alloy layer is preferably set in a range from 1.0 µm to 2.0 µm. A plating film having a thickness smaller than 1.0 µm cannot have sufficient stability and bonding properties. An increase in the thickness leads to an increase in a thermal energy required for the tin-bismuth alloy during a bonding process. Accordingly, it is desired to minimize an increase in the thickness.

A heat treatment is effected on the layered body of the core substrate 12, the adhesive sheets 51 and the build-up layer units 33, 34. The temperature of heat is set in a range from 150 degrees Celsius to 180 degrees Celsius. Pressure is applied to the layered body in the direction perpendicular to the front and back surfaces of the core substrate 12 during the heat treatment. The core substrate 12, the adhesive sheets 51, 51 and the build-up layer units 33, 34 are in this manner tightly united together. The adhesive sheets 51 are softened in response to a rise in the temperature. The adhesive sheets 51 thus deform in line with the surfaces of the core substrate 12 and the layered bodies. Such deformation of the adhesive sheets 51 serves to absorb the unevenness of the surfaces of the core substrate 12 and the layered bodies. Simultaneously, the softened adhesive sheets 51 allow the copper particles between the electrically-conductive lands 31, 41 to reliably contact with one another. The flowability of the copper particles serves to absorb a change in the distance between the electrically-conductive lands 31, 41.

The tin-bismuth alloy melts after the adhesive sheets 51 have been softened. The tin forms intermetallic compounds, namely the copper-tin ($Cu_6Sn_5$) alloy layers 47, on the surfaces of the electrically-conductive lands 31, 41 and the surfaces of the copper particles. The activator serves to accelerate generation of the intermetallic compounds. The copper-tin alloy layers 47 on the copper particles are brought in contact with one another. The copper-tin alloy layers 47 serve to bond the copper particles to the electrically-conductive land 31, 41 as well as the copper particles to one another. The spherical conductive bodies 45 are established. Simultaneously, bismuth fills a space between the copper-tin alloy layers 47. The bismuth embeds the spherical conductive bodies 45 between the electrically-conductive lands 31, 41. The bismuth is hardened or cured. The bismuth material 48 is formed. Since the copper particles are kept in a solid state, the electrically-conductive binder 53 is prevented from being excessively flattened under an applied pressure.

The matrix material made of the thermosetting resin is then hardened and cured. The spherical conductive bodies 45 and the bismuth material 48 are wrapped or embedded in the cured matrix material. The adhesive sheets 51 are hardened or cured. The matrix material and the adhesive sheets 51 are united together. The matrix material and the adhesive sheets 51 in combination form the insulating bases 43 of the bonding layers 42. When the curing of the adhesive sheets 51 is completed, the build-up layer units 33, 34 are then coupled to the front and back surfaces of the core substrate 12, respectively. The printed wiring board 11 is then released from the heat and pressure. The printed wiring board 11 is in this manner produced.

The bismuth material 48 in the printed wiring board 11 has the melting point of 271 degrees Celsius. In the case where an electronic component such as a semiconductor chip is mounted on the printed wiring board 11, for example, the printed wiring board 11 is subjected to heat having a temperature equal to or higher than the melting point of solder. Solder generally melts at a temperature lower than the 271 degrees Celsius. The bismuth material 48 is thus kept in a solid state. A sufficient bonding strength is maintained. Since the thickness of the tin-bismuth alloy layer is set smaller than 5.0 µm (preferably smaller than 2.0 µm) as described above, a minimum amount of a thermal energy is sufficient to cause reaction of the tin with the copper.

Copper particles of a different kind may be added to the aforementioned electrically-conductive binder 53 in addition to the aforementioned copper particles. The copper particles of a different kind are each coated with a silver plating layer or a tin plating layer. The copper particles of the different kind contribute to improvement of the wettability of the copper. The bonding strength of the copper is thus improved.

Figure 4:
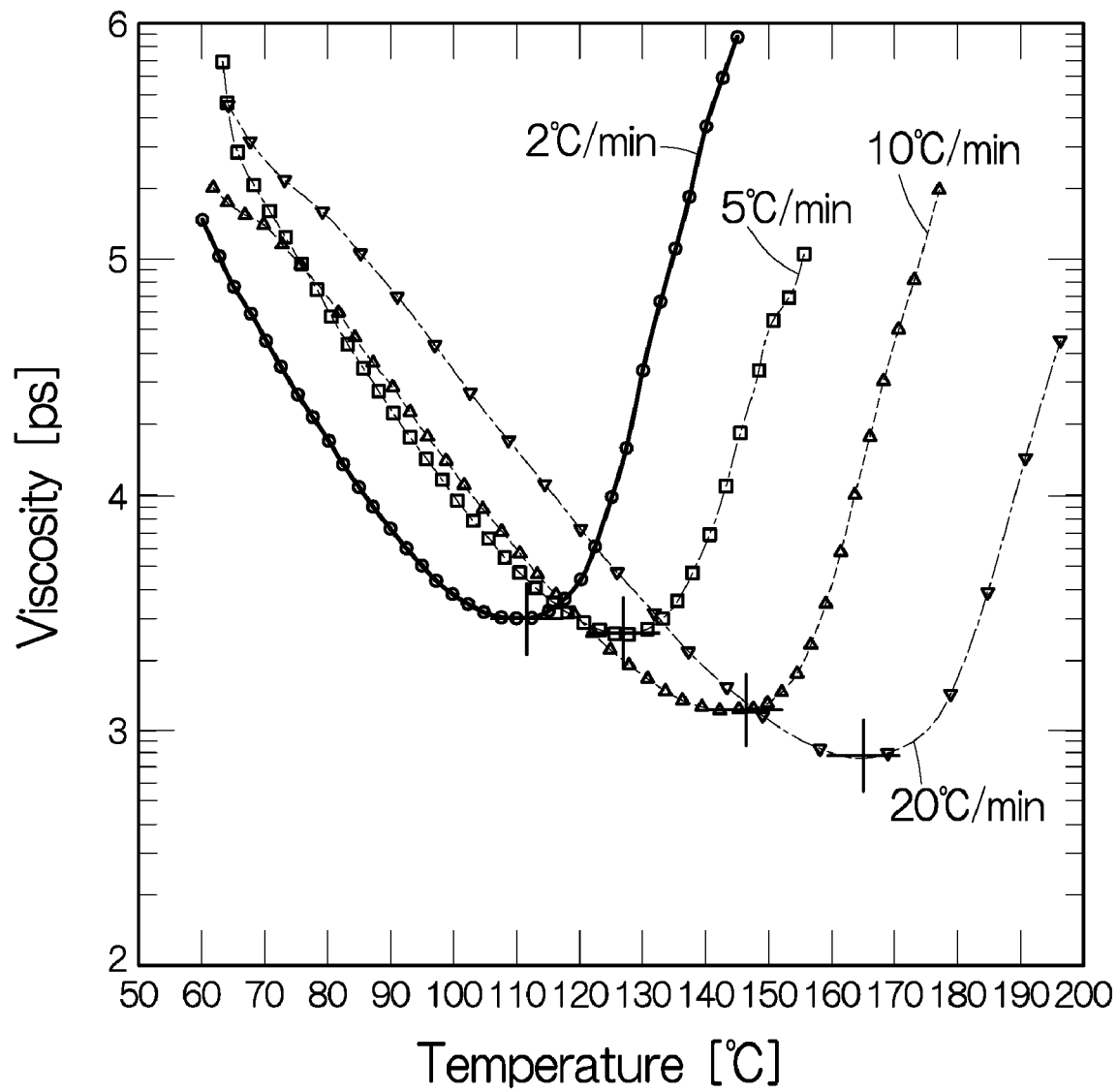
FIG. 4 is a graph presenting the relationship between the viscosity and the temperature, of the adhesive sheet.
Figure 5:
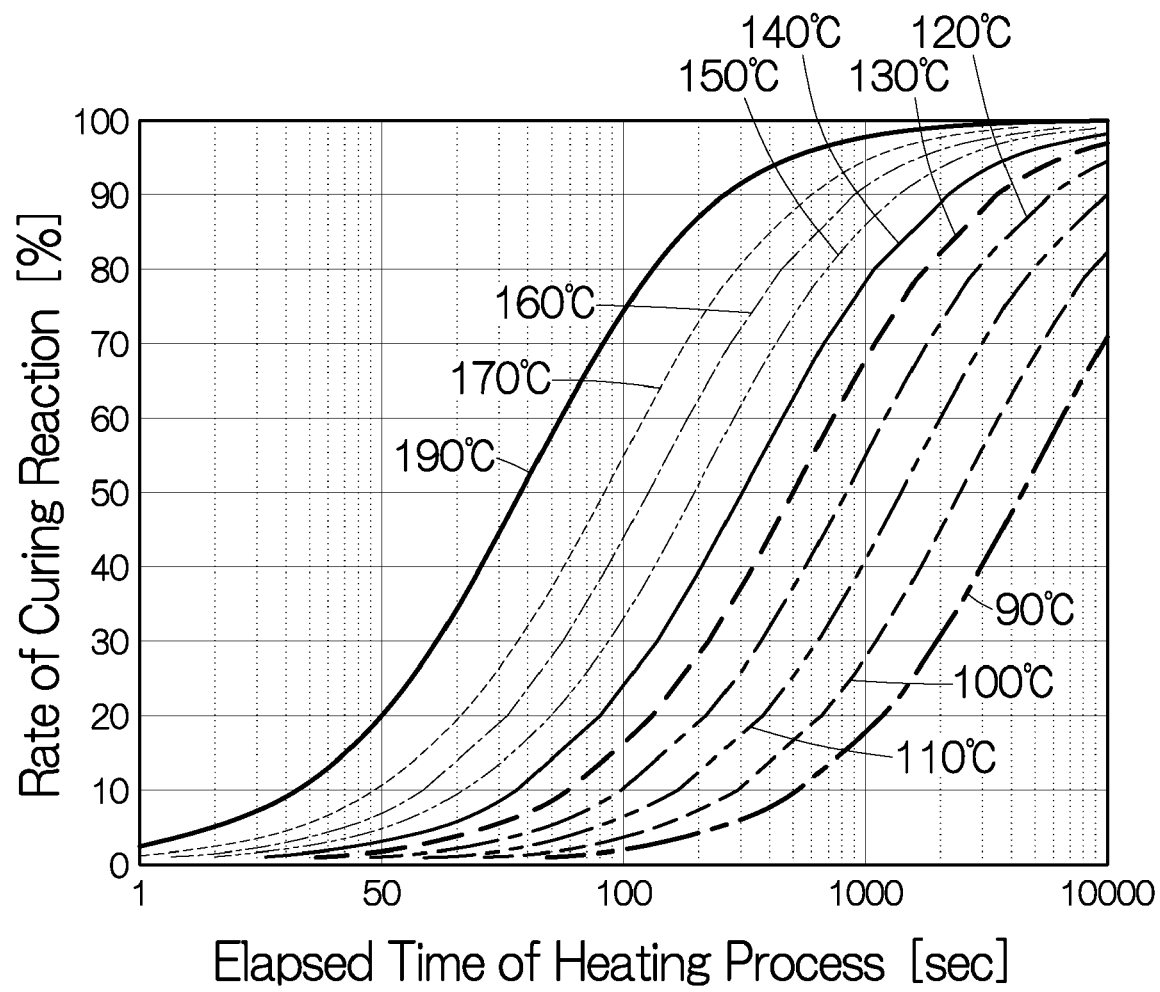
FIG. 5 is a graph presenting the relationship between the elapsed time and the rate of curing reaction during a heat treatment on the adhesive sheet.

FIG. 4 is a graph presenting the relationship between the viscosity and the temperature for the adhesive sheet 51 made of a material according to a specific example. As is apparent from FIG. 4, a rapid increase in the temperature results in a delay of softening of the adhesive sheet 51. Moreover, the rapider pace the temperature increases at, a higher temperature the curing of the adhesive sheet 51 starts at. When the temperature of heat applied to the adhesive sheet 51 increases by 10 degrees Celsius per minute, for example, the adhesive sheet 51 starts to get cured at 146.3 degrees Celsius. FIG. 5 is a graph presenting the relationship between the elapsed time and the rate of curing reaction during the heat treatment on the adhesive sheet 51. It is obvious from FIG. 5 that, the higher the temperature of the heat is, the shorter time the adhesive sheet 51 is cured in. Accordingly, adjustment on the temperature of the heat and the pace of increasing the temperature of the heat can be utilized to control the start of softening, the start of curing, and the completion of curing, of the adhesive sheet 51.

Figure 6:
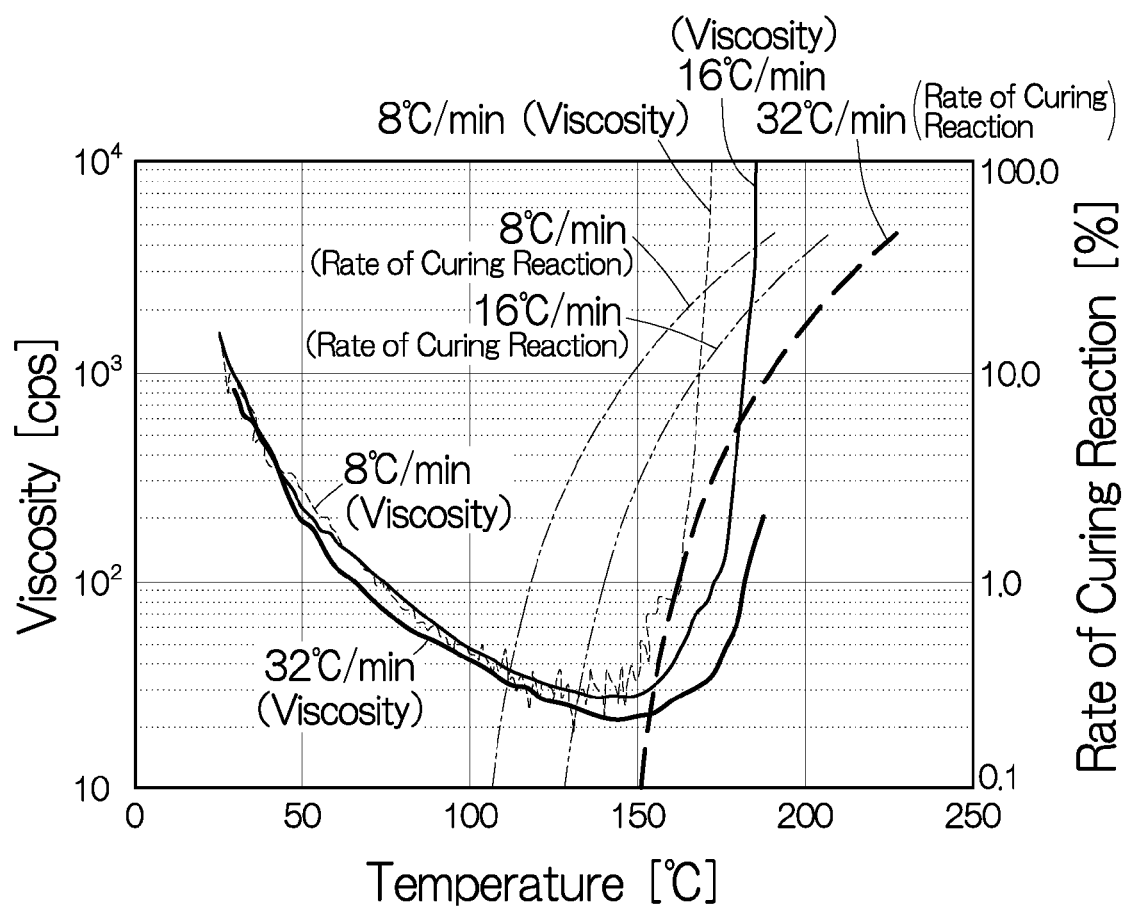
FIG. 6 is a graph presenting the relationship between the viscosity and the temperature of matrix material contained in the electrically-conductive binder.
Figure 7:
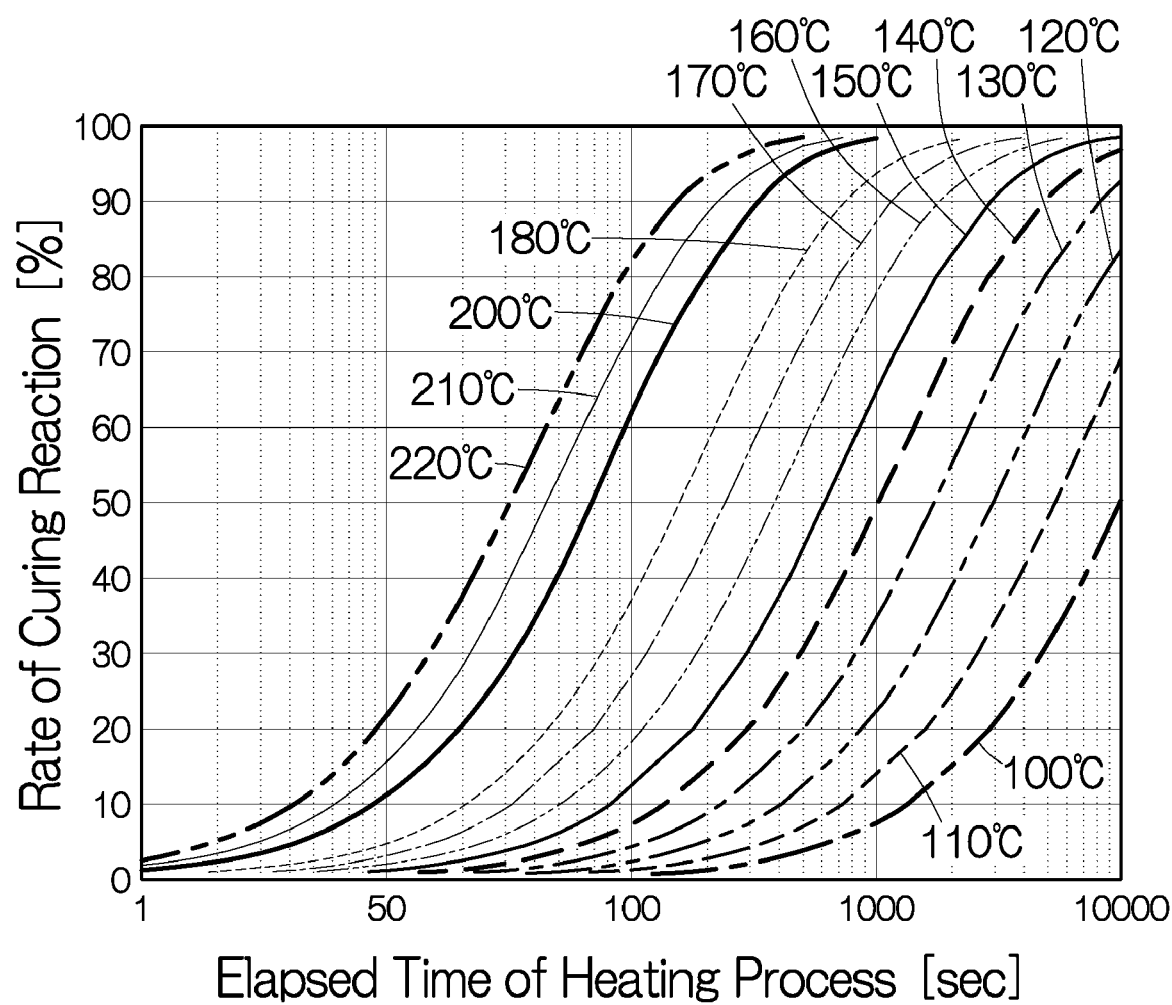
FIG. 7 is a graph presenting the relationship between the elapsed time and the rate of curing reaction during a heat treatment on the matrix material contained in the electrically-conductive binder.

FIG. 6 is a graph presenting the relationship between the viscosity and the temperature of the matrix material 53a contained in the electrically-conductive binder 53. As is apparent from FIG. 6, the viscosity depends on the temperature irrespective of the pace of an increase in the temperature. Curing starts when the temperature reaches 140 degrees Celsius approximately at any pace of an increase in the temperature. As the temperature increases at a rapider pace, the curing occurs at a higher temperature. FIG. 7 is a graph presenting the relationship between the elapsed time and the rate of curing reaction during the heat treatment on the matrix material 53a. It is obvious from FIG. 7 that the higher the temperature of the heat gets, the shorter time the matrix material 53a is cured in. Accordingly, adjustment on the temperature of the heat and the pace of increasing the temperature of the heat can be utilized to control the start of softening, the start of curing, and the completion of curing, of the matrix material 53a.

Figure 8:
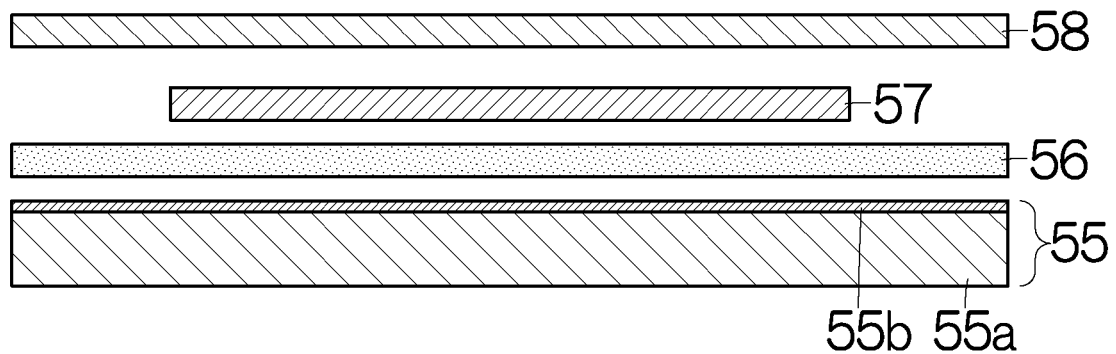
FIG. 8 is a sectional view schematically illustrating a metallic foil overlaid on a support body.

Here, a brief description will be made on a method of making the build-up layer units 33, 34. As depicted in FIG. 8, a support body 55 is prepared. The support body 55 includes an epoxy resin base 55a. Glass fiber cloth is embedded in the epoxy resin base 55a. The fibers of the glass fiber cloth extend along the front and back surfaces of the epoxy resin base 55a. The glass fiber cloth is impregnated with epoxy resin so as to form the epoxy resin base 55a. The thickness of the epoxy resin base 55a is set in a range from 0.3 mm to 0.4 mm. A copper foil 55b having a thickness of 9.0 µm approximately is attached to the front surface of the epoxy resin base 55a. The epoxy resin base 55a exhibits a rigidity sufficient for preventing deformation such as shrinkage or curvature in the process of producing the build-up layer units 33, 34.

An adhesive film 56, a first metallic film 57 and a second metallic film 58 are overlaid in this sequence on the front surface of the support body 55. The adhesive film 56 is made of a thermosetting resin such as epoxy resin. The first metallic film 57 is made out of a copper foil having a thickness of 18.0 μm approximately, for example. The second metallic film 58 is made out of two layers of copper foils having a total thickness of 18.0 μm approximately, for example. An intermediate barrier layer is sandwiched between the copper foils of the second metallic film 58. The intermediate barrier layer is made of nickel, for example. The intermediate barrier layer may be made of a material capable of remaining after the etching of a copper foil. The second metallic film 58 extends wider out of the contour of the first metallic film 57. Vacuum pressing is applied to the support body 55, the adhesive film 56, the first metallic film 57 and the second metallic film 58. A vacuum hot press is employed in the vacuum pressing. The second metallic film 58 is bonded to the front surface of the support body 55 outside the contour of the first metallic film 57. The back surface of the second metallic film 58 coheres to the front surface of the first metallic film 57.

Figure 9:
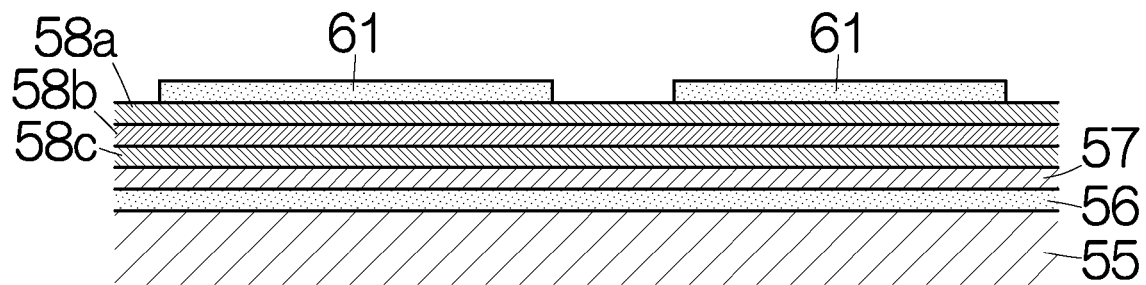
FIG. 9 is a sectional view schematically illustrating the metallic foil.
Figure 10:
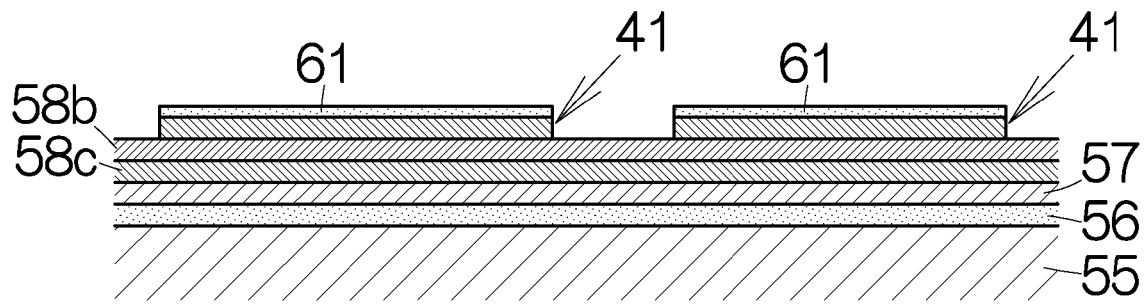
FIG. 10 is a sectional view schematically illustrating a method of forming an electrically-conductive land.

As depicted in FIG. 9, photolithography is effected on a copper foil 58a on the front side of the second metallic film 58, for example. A photoresist 61 is formed on the surface of the copper foil 58a. The copper foil 58a is exposed to an etchant at a position off the photoresist 61, for example. As depicted in FIG. 10, the copper foil 58a is removed from the position off the photoresist film 61. An intermediate barrier layer 58b serves to block the etchant. A copper foil 58c on the back side of the second metallic film 58 thus remains as it is. An electrically-conductive pattern made of copper is in this manner formed on the surface of the intermediate barrier layer 58b. The electrically-conductive pattern corresponds to the aforementioned electrically-conductive lands 41.

Figure 11:
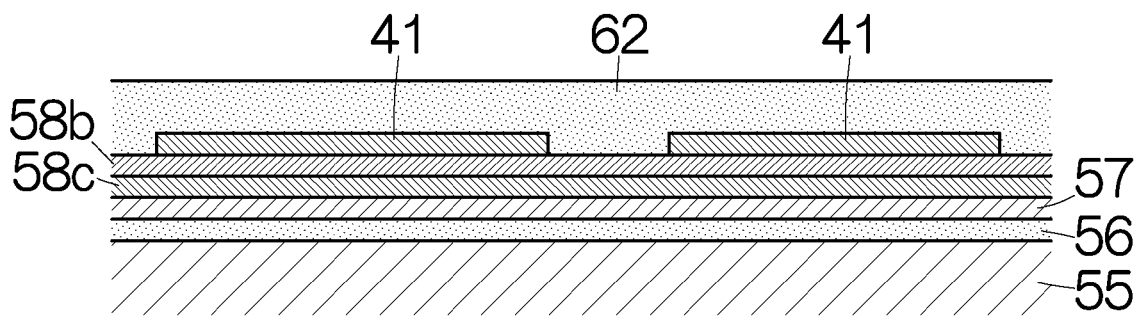
FIG. 11 is a sectional view schematically illustrating an insulating sheet overlaid on a copper foil.

As depicted in FIG. 11, an insulating sheet 62 is overlaid on the surface of the intermediate barrier layer 58b. The insulating sheet 62 and the intermediate barrier layer 58b are subjected to heat under pressure, so that the insulating sheet 62 is bonded to the surface of the intermediate barrier layer 58b. The insulating sheet 62 covers over the electrically-conductive lands 41. An adhesive sheet made of a thermosetting resin, a prepreg of a thermosetting resin containing glass fiber cloth, or the like, may be employed as the insulating sheet 62.

Figure 12:
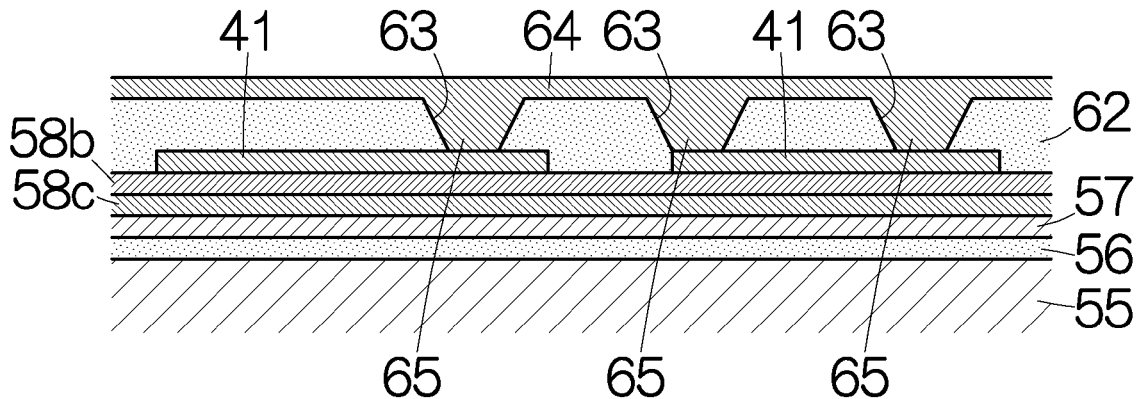
FIG. 12 is a sectional view schematically illustrating an electrically-conductive layer formed on the insulating sheet.
Figure 13:
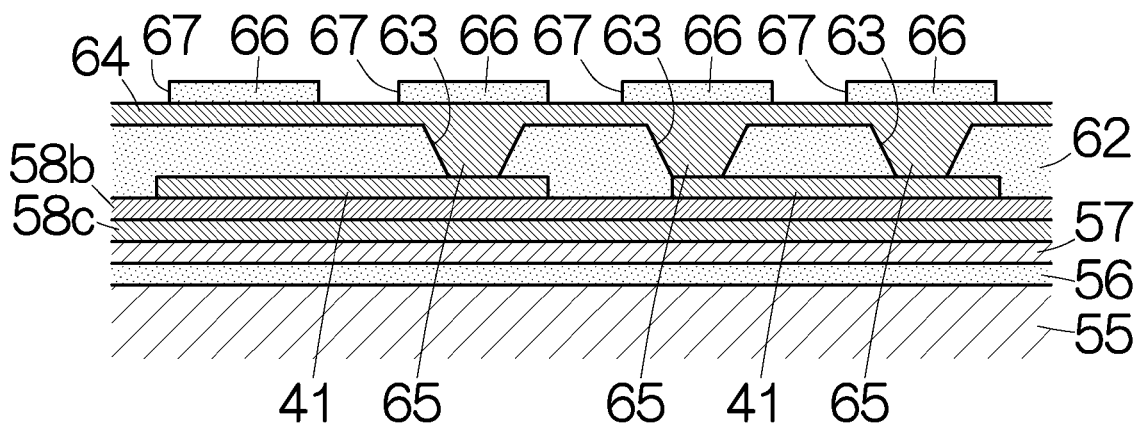
FIG. 13 is a sectional view schematically illustrating a photoresist formed on the surface of the electrically-conductive layer.
Figure 14:
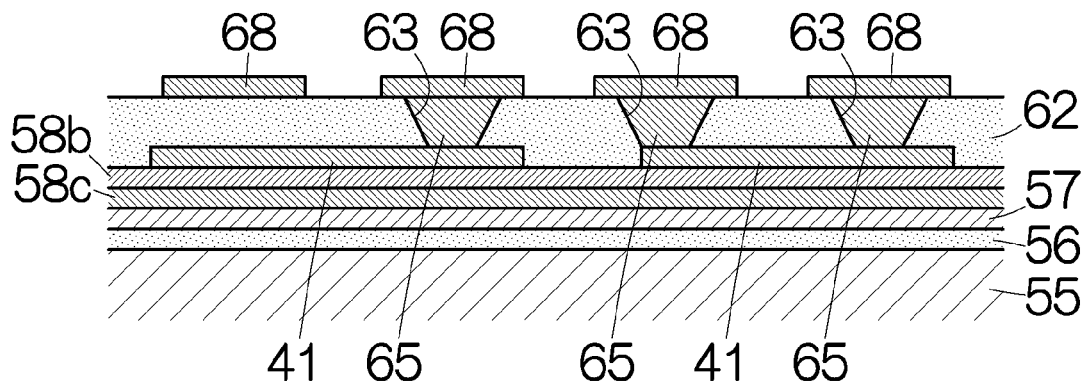
FIG. 14 is a sectional view schematically illustrating an electrically-conductive pattern formed on the insulating sheet.
Figure 15:
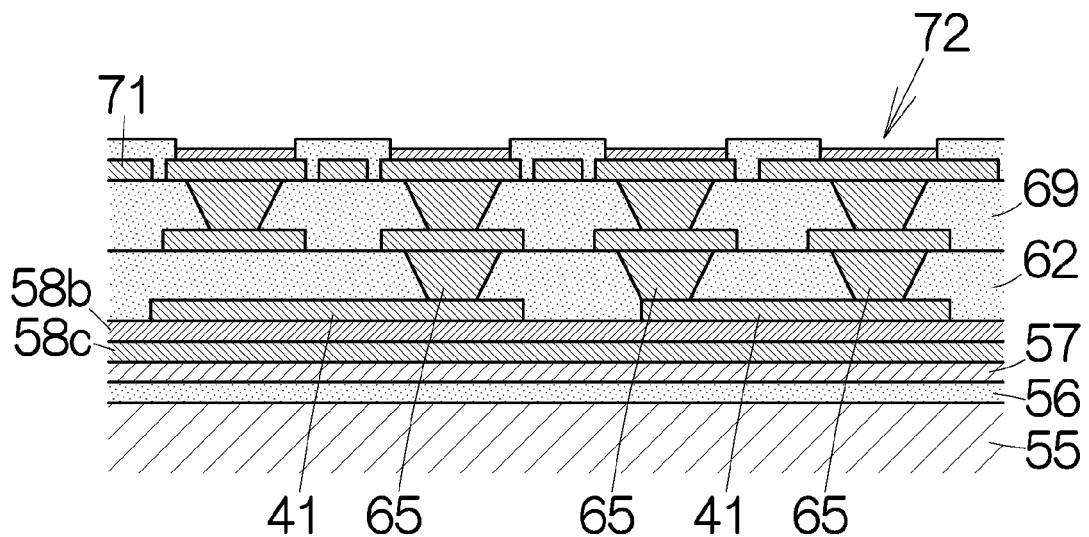
FIG. 15 is a sectional view schematically illustrating the build-up layer unit established on the support body.

As depicted in FIG. 12, through bores 63 are formed in the insulating sheet 62 at predetermined positions. A laser is utilized to form the through bores 63. The through bore 63 defines a hollow space on the corresponding electrically-conductive land 41. Copper plating is effected on the surface of the insulating sheet 62, for example. An electrically-conductive layer 64 made of copper is in this manner formed on the surface of the insulating sheet 62. A via 65 made of copper is established in the through bore 63. As depicted in FIG. 13, a photoresist 66 is formed on the surface of the electrically-conductive layer 64, for example. The photoresist 66 defines voids 67 in a predetermined pattern on the surface of the electrically-conductive layer 64. The voids 67 are located at positions off the vias 65. As depicted in FIG. 14, a predetermined electrically-conductive pattern 68 is formed out of the electrically-conductive layer 64 based on an etching process. Such lamination of insulating sheets 69 and formation of electrically-conductive patterns 71 are then repeated. A predetermined number of layers of the electrically-conductive patterns 71 are in this manner formed. A predetermined layered body 72 is formed on the intermediate barrier layer 58b, as depicted in FIG. 15.

Figure 16:
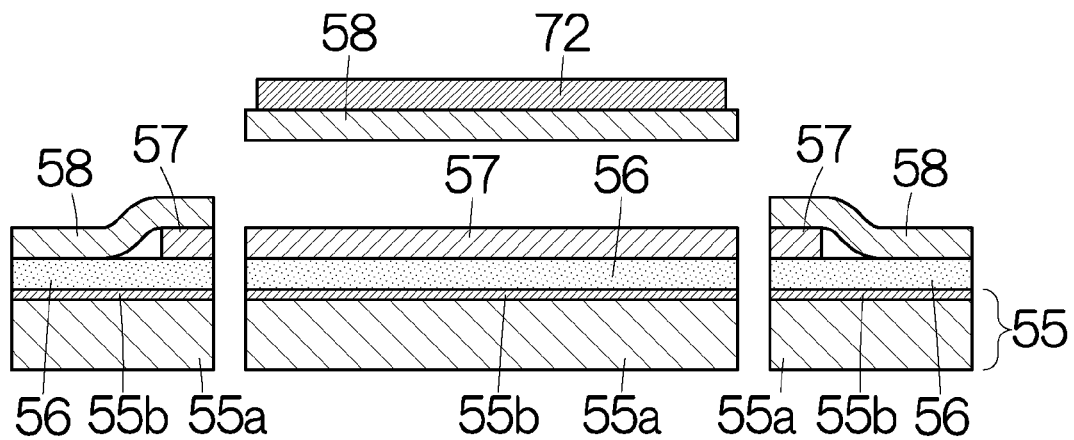
FIG. 16 is a sectional view schematically illustrating the build-up layer unit after removal of the copper foil.

As depicted in FIG. 16, the support body 55, the adhesive film 56, the first metallic film 57 and the second metallic film 58 are cut out along the contour of the first metallic film 57 inside the contour of the first metallic film 57. The copper foil 58a, the intermediate barrier layer 58b and the layered body 72 are separated from the surface of the first metallic film 57. The intermediate barrier layer 58b is removed based on an etching process. The electrically-conductive lands 41 are exposed. The build-up layer units 33, 34 are in this manner formed. Nickel and gold plating films may be formed on the surfaces of the electrically-conductive patterns 71 and the electrically-conductive lands 41 on the front and back surfaces of the build-up layer units 33, 34.

Figure 17:
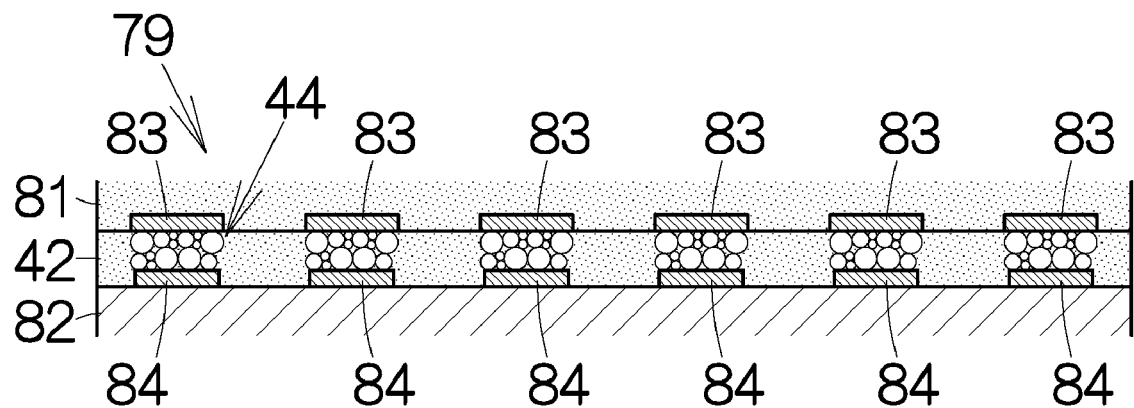
FIG. 17 is a side view schematically illustrating the cross-section of a printed circuit board unit according to an embodiment of the present invention.
Figure 18:
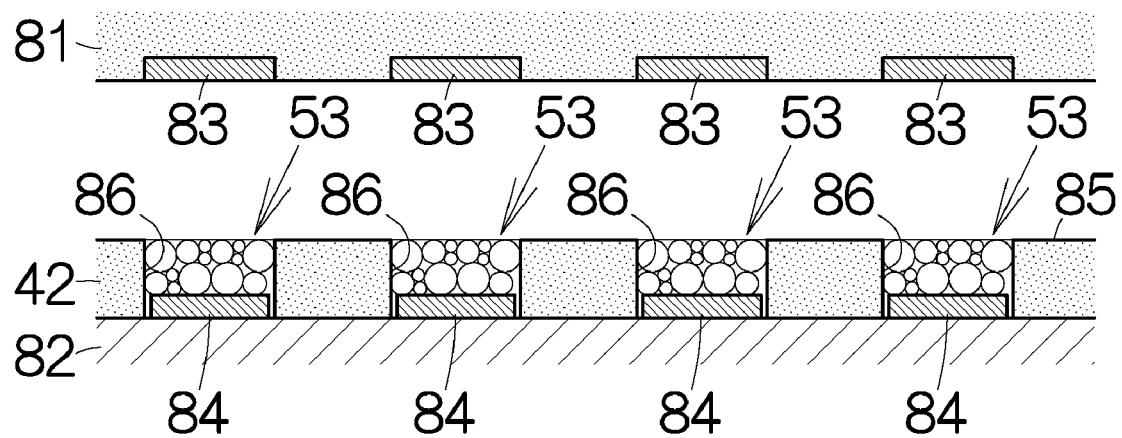
FIG. 18 is an enlarged partial sectional view schematically illustrating a method of making the printed circuit board unit.

As depicted in FIG. 17, the aforementioned bonding layer 42 may be utilized for mounting an electronic component 81 such as a semiconductor chip in the process of making a printed circuit board unit 79, for example. The bonding layer 42 can function as a so-called underfill material. The electrically-conductive body 44 in the bonding layer 42 serves to connect electrically-conductive lands 83 on the electronic component 81 to corresponding electrically-conductive lands 84 on the printed wiring board 82. In this case, an adhesive sheet 85 is sandwiched between the electronic component 81 and the printed wiring board 82 in the same manner as described above, as depicted in FIG. 18, for example. An opening 86 is formed in the adhesive sheet 85 between the electrically-conductive land 83 on the electronic component 81 and the corresponding electrically-conductive land 84 on the printed wiring board 82. The opening 86 penetrates through the adhesive sheet 85. The electrically-conductive land 83 on the electronic component 81 is opposed to corresponding the electrically-conductive land 84 on the printed wiring board 82 in the opening 86. The opening 86 is filled with the electrically-conductive binder 53.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of making a printed wiring board, comprising:
setting an adhesive sheet made of a thermosetting resin between a first substrate and a second substrate so that a first electrically-conductive land provided on the first substrate is opposed to a second electrically-conductive land provided on the second substrate through an opening formed in the adhesive sheet;
filling the opening with an electrically-conductive binder including matrix material and fillers, the matrix material containing a thermosetting resin, the fillers including copper particles each coated with a tin bismuth alloy, the fillers dispersed in the matrix material so as to unite with the first and second electrically-conductive lands based on intermetallic compounds formed between the fillers and the first and second electrically-conductive lands, respectively;
pressing the first substrate against the second substrate with heating to soften the adhesive sheet; and
melting the tin bismuth alloy having a melting point higher than a softening temperature of the adhesive sheet by heating after the adhesive sheet has been softened;
heating and hardening the matrix material after the tin bismuth alloy has molten; and heating and hardening the adhesive sheet after the matrix material has been hardened.

2. The method according to claim 1, wherein the tin bismuth alloy of the fillers having the melting point higher than the softening temperature of the adhesive sheet.

3. The method according to claim 1, wherein the tin bismuth alloy contains bismuth in a range from 50 wt % to 60 wt %.

4. A method of making a printed circuit board unit, comprising:
   setting an adhesive sheet made of a thermosetting resin between an electronic component and a printed wiring board so that a first electrically-conductive land provided on the electronic component is opposed to a second electrically-conductive land provided on the printed wiring board through an opening formed in the adhesive sheet;
   filling the opening with an electrically-conductive binder including matrix material and fillers, the matrix material containing a thermosetting resin, the fillers including copper particles each coated with a tin bismuth alloy, the fillers dispersed in the matrix material so as to unite with the first and second electrically-conductive lands based on intermetallic compounds formed between the fillers and the first and second electrically-conductive lands, respectively;
   pressing the electronic component against the printed wiring board with heating to soften the adhesive sheet;
   melting the tin bismuth alloy having a melting point higher than a softening temperature of the adhesive sheet by heating after the adhesive sheet has been softened;
   heating and hardening the matrix material after the tin bismuth alloy has melted; and
   heating and hardening the adhesive sheet after the matrix material has been hardened.

5. The method according to claim 4, wherein the tin bismuth alloy of the fillers having the melting point higher than the softening temperature of the adhesive sheet.

6. The method according to claim 4, wherein the tin bismuth alloy contains bismuth in a range from 50 wt % to 60 wt %.

* * * * *